United States Patent [19]

Kaneko

[11] Patent Number: 5,683,596

[45] Date of Patent: Nov. 4, 1997

[54] METHOD FOR ETCHING COMPOUND SOLID STATE MATERIAL

[75] Inventor: Yawara Kaneko, Fuchu, Japan

[73] Assignee: Hewlett-Packard Company, Palo Alto, Calif.

[21] Appl. No.: 587,173

[22] Filed: Jan. 16, 1996

[30] Foreign Application Priority Data

Feb. 1, 1995 [JP] Japan ................................. 7-036302

[51] Int. Cl.$^6$ ............................................. H01L 21/306
[52] U.S. Cl. ..................... 216/83; 156/662.1; 156/628.1
[58] Field of Search ............................ 216/83; 156/625.1, 156/635.1, 662.1

[56] References Cited

U.S. PATENT DOCUMENTS

| | | | |
|---|---|---|---|
| 3,565,702 | 2/1971 | Nelson | 148/172 |
| 3,715,245 | 2/1973 | Barnett et al. | 148/171 |
| 3,960,618 | 6/1976 | Kawamura et al. | 148/171 |
| 4,030,949 | 6/1977 | Horikoshi et al. | 148/171 |
| 4,373,989 | 2/1983 | Mattauch et al. | 156/635 |
| 4,500,367 | 2/1985 | Keramidas et al. | 148/171 |
| 5,334,278 | 8/1994 | Lee | 117/57 |
| 5,354,420 | 10/1994 | Russell et al. | 156/643 |

OTHER PUBLICATIONS

Pankove, J.I., "Electrolytic Etching of GaN", Journal of Electrochemical Society, Aug. 1972, vol. 119, No. 8, pp. 1118–1119.

Pearton, S.J. et al., "Low Bias Electron Resonance Plasma Etching of GaN, AlN, and InN", Applied Physics Letter, Apr. 25, 1994, vol. 64, No. 17, pp. 2294–2296.

Logan, R.A. et al., "Heteroepitaxial Thermal Gradient Solution Growth of GaN", Journal of Electrochemical Society, Dec. 1972, vol. 119, No. 12, pp. 1727–1735.

Kishino, Katsumi et al., "Selective Meltbacked Substrate Inner–Stripe AlGaAs/GaAs Lasers Operated under Room Temperatures CW Condition", Japanese Journal of Applied Physics, Jul. 1983, vol. 22, No. 7, pp. L473–L475.

*Primary Examiner*—R. Bruce Breneman
*Assistant Examiner*—Michael E. Adjodha

[57] ABSTRACT

A method for etching compound solid state material by a meltback method that provides fast etching speed and a smooth surface, and in which the problem of fast saturation of the solvent is solved, high workability is achieved, and the range of application targets is wide. Etching is performed at a desired location on the surface of the compound solid state material. A solvent for the material is placed in contact with a part of the surface of the material, and at least one part of the other surface of the solvent is placed in contact with the atmosphere, such that at least one volatile component of the structural component of the material that dissolves in the solvent easily evaporates.

10 Claims, 3 Drawing Sheets

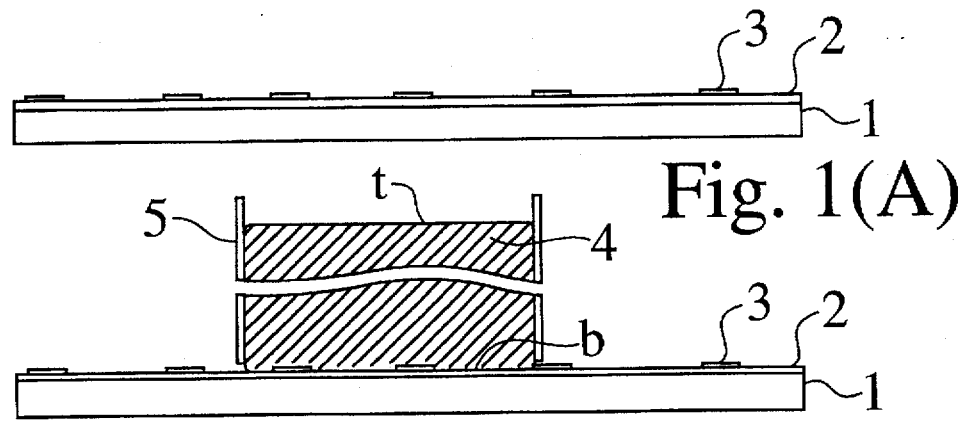
Fig. 1(A)
Fig. 1(B)
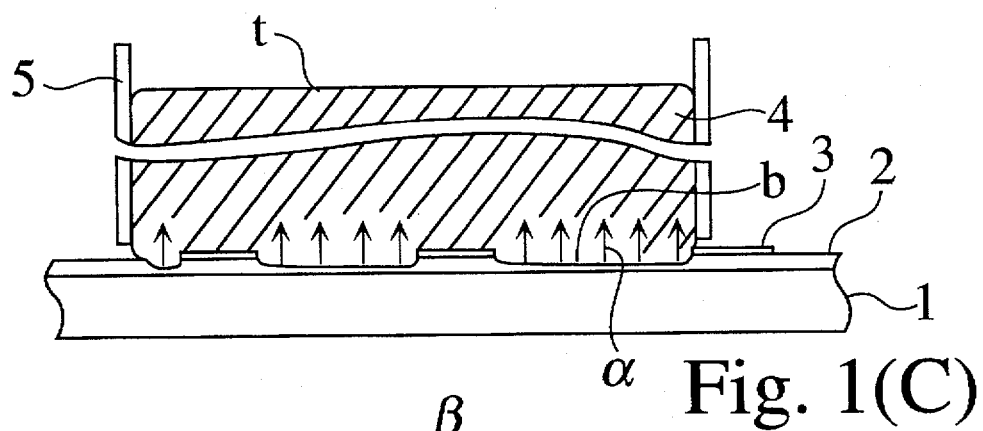
Fig. 1(C)
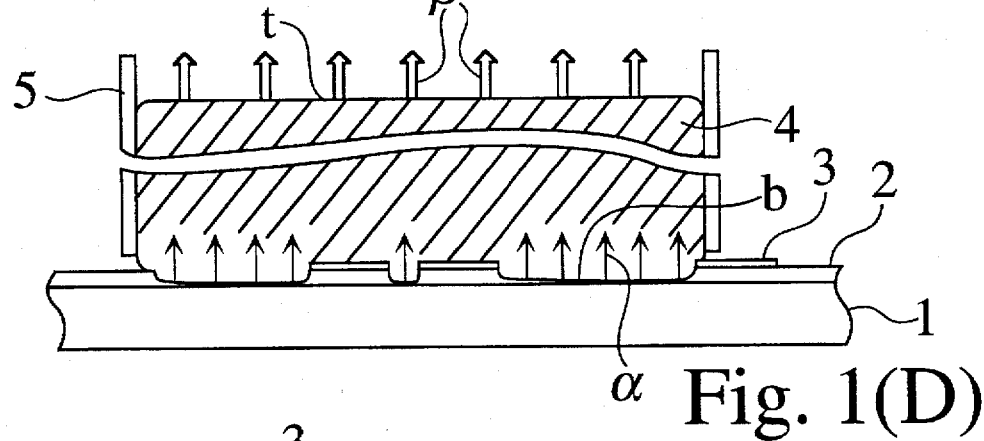
Fig. 1(D)
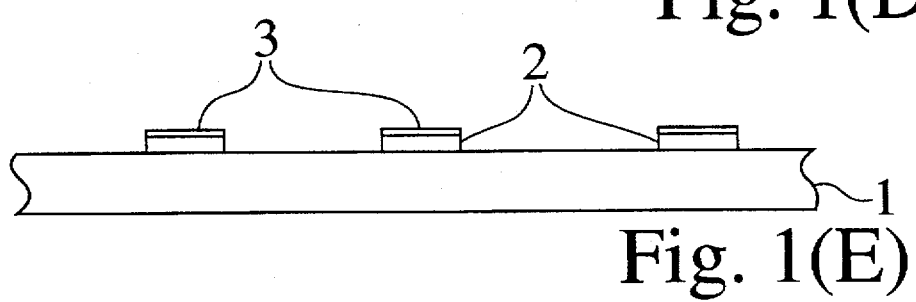
Fig. 1(E)

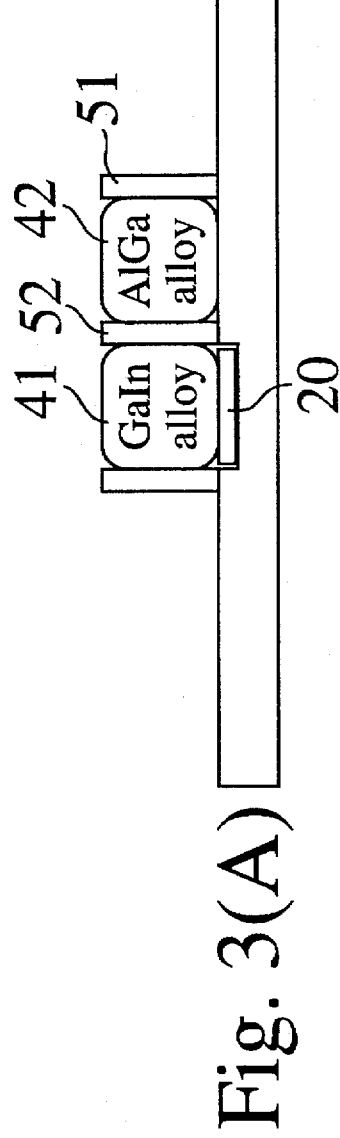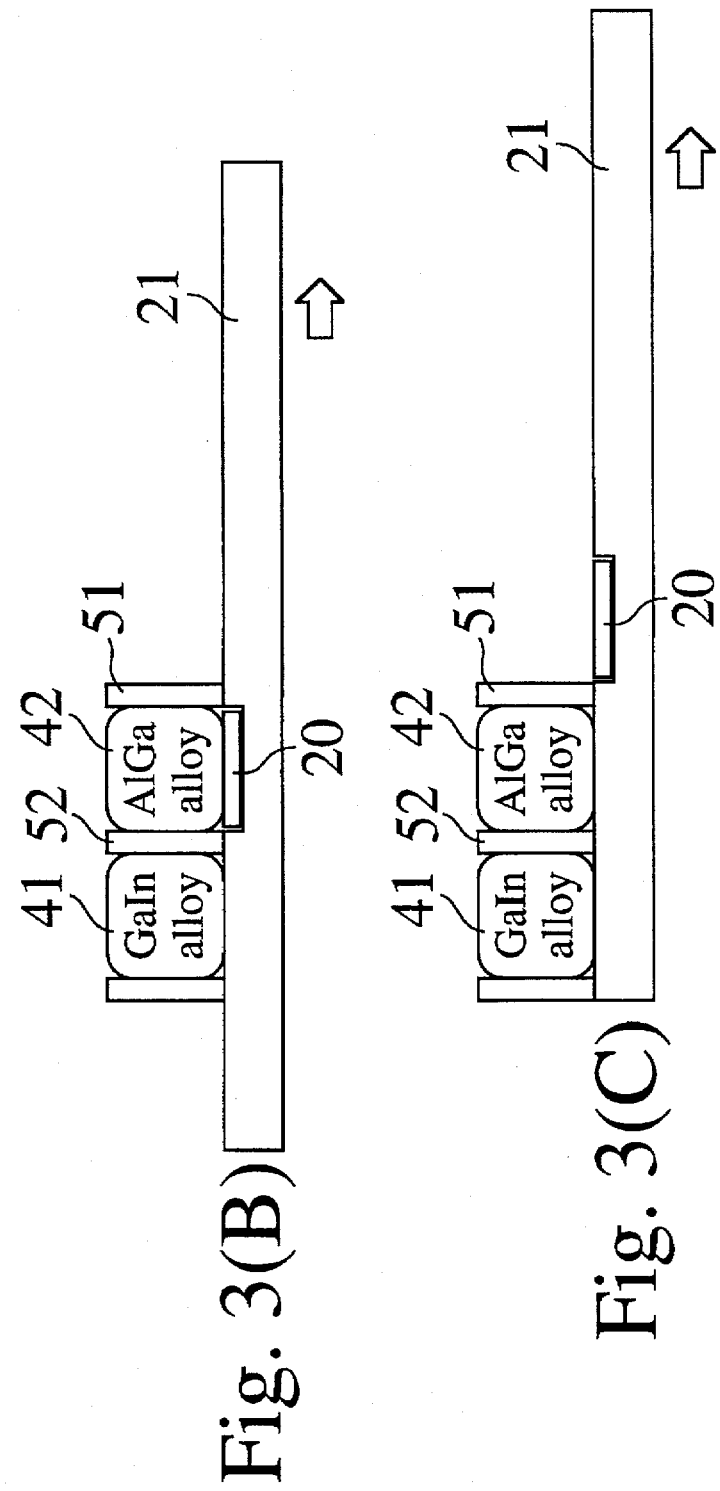

METHOD FOR ETCHING COMPOUND SOLID STATE MATERIAL

BACKGROUND OF THE INVENTION

1. Technical Field

The invention relates to the etching of a compound solid state material. More particularly, the invention relates to the etching of a compound solid state material using a meltback method.

2. Description of the Prior Art

A variety of conventional techniques that may be used for etching compound solid state material, e.g. semiconductors, have been known for some time. These techniques are broadly classified into wet etching methods and dry etching methods.

Wet etching methods typically include such steps as placing a refractory or easily melting coating on the whole surface of a material to be etched, radiating light only on prescribed portions of the coating, forming a mask layer that does not dissolve in an etchant, exposing the material to be etched to the etchant, and then removing the etchant; or etching methods that form a mask layer having a prescribed pattern on the surface of said material by using a material that does not dissolve in the etchant. See, for example J. I. Pankove, *Electrolytic Etching of GaN*, Journal of Electrochemical Society, vol. 119, no. 8, pp. 1118–1119 (August 1972).

Dry etching methods include those methods where a mask layer having a prescribed pattern is formed by an appropriate technique on the surface of a material to be etched. The material is placed in a gas atmosphere that readily reacts with the material. The portions of the material that are exposed to the gas atmosphere, other than the mask layer, react with the gas atmosphere, and the reaction product is then removed from the process environment. See, for example S. J. Pearton, C. R. Abernathy, *Low bias electron resonance plasma etching of GaN, AlN, and InN*, Applied Physics Letter, vol. 64, no. 17, pp. 2294–2296 (25 Apr. 1994).

When wet etching methods are used, the etching surface becomes smooth and the finished product quality is excellent (cf. dry etching which produces a rough surface). However, while etchants are known for many materials (i.e. chemically stable materials), appropriate etchants are not yet known for certain types of solid state material. Consequently, for these materials etching is either not possible or the etching speed is slow.

The meltback method (see, for example K. Kishino, S. Kinoshita, S. Konno, T. Tako, *Selective Meltbacked Substrate Inner-Stripe AlGaAlrGaAr Lasers Operated Under Room Temperature CW Condition*, Japanese Journal of Applied Physics, vol. 22, no. 7, pp. L473–L475 (July 1983)) is thought to provide an etching method that does not suffer from the foregoing problems. That is, the method may be used to etch solid state materials that cannot be etched by wet etching. Moreover, the etching surface is not damaged using the meltback surface as it is in dry etching.

During meltback etching, a high-temperature solvent is placed in contact with the surface of the material to be etched on a desired portion of the material surface. The material components, i.e. a hardly volatile component, referred to herein as the hardly volatile component, and a readily volatile component, referred to herein as the volatile component, are introduced into the solvent (i.e. they are dissolved into the solvent), and the exposed portion of the material is etched.

In the meltback method, when the solubility of the solid state material in the solvent is low, the solvent becomes quickly saturated by the introduced volatile component, such that etching is no longer possible. Therefore, it becomes necessary either to replace the solvent frequently or to use a large amount of solvent. If the solvent is frequently replaced, lower workability results. If large amounts of solvent are used, the application field is limited, and operating and equipment costs are high.

SUMMARY OF THE INVENTION

The invention provides a method for etching compound solid state material that solves the problem of rapid saturation of the solvent; that achieves high workability; and where the application field covers a wide range of etching methods. The invention employs a meltback method that produces a smooth etching surface and that achieves relatively high-speed etching, even for chemically stable materials.

It is known that a solvent saturated by the volatile component separates from the volatile component when the solvent is placed in an atmosphere: (1) containing combustible gas components in which the solvent readily reacts with the highly volatile component; or (2) where the highly volatile component easily evaporates. When these properties are applied to an etching method using the meltback method, frequent replacement of the solvent or the use of large amounts of solvent become unnecessary. Therefore, the invention provides excellent etching performance using the meltback method.

The etching method herein described places a portion of the solvent for the material to be etched on desired locations of one surface of the material. At least a part of the solvent is exposed to an atmosphere, such that at least some of the volatile components of said material that are dissolved in the solvent are readily volatilized.

The preferred etching method provides:

(1) a solvent consisting of a molten material having the same component as at least one hardly volatile component of the compound solid state material; or a molten material in which the compound solid state material is soluble;

(2) a solvent that is used as a thin film;

(3) a solvent with a component added to increase the diffusion speed of the volatile component; and (4) an atmosphere of a gas that readily reacts with at least one volatile component of the compound solid state material; or an atmosphere in which the partial pressure of the volatile component is less than the vapor pressure of the volatile component in the solvent.

The compound solid state material that is the etching target preferably has a composition where at least one component among multiple components forming the material is a hardly volatile component when compared to the other components; and at least one of the other components is a volatile component when compared to the other components. In one embodiment of the invention, compound solid state materials that are obtained by liquid phase epitaxy (see, for example R. A. Logan, C. D. Thurmond, *Heteroepitaxial Thermal Gradient Solution Growth of GaN*, Journal of Electrochemical Society, vol. 119, no. 12, pp. 1727–1735 (December 1972)) are readily processed using the invention. For example, semiconductors or special ceramics can be etched using the invention.

Materials with which the invention may be used include, for example semiconductors consisting of a hardly volatile component made of elements in one or more kinds of group III, group II; or group I and a volatile component made of elements in one or more kinds of group V, group VI or group VII, e.g. GaN, GaAs, GaSb, GaP, InP, InAs, AlGaAs, GaInAs, GaInP, AlGaInN, BAlGaInN, AlGaInP, group III-V GaInAsP, ZnS, ZnSe, CDs, CdSe, CdTe, ZnTe, MgTe, ZnSSe, ZnCdS, ZnCdSe, ZnMgS, ZnMgSe, CdSSe, CdZnTe, HgCdTe, HgZnTe.

A solvent is placed in contact with the surface of the compound solid state material, typified by the foregoing semiconductor materials, at desired locations on the surface of the material, i.e. at the location to be etched, and takes in (i.e. dissolves) the solid state material. Preferably, the solvent is a molten material that includes at least one hardly volatile component in the structural components of the material, or a molten material in which the solid state material is soluble.

For example, for a semiconductor material where the compound solid state material is two-component system, e.g. GaAs, GaN, or ZnSe, a molten material such as Ga, Al, In, or Hg is used. Elements such as Mg, Zn, and Cd sublimate and become a vapor (not a molten material) when they are heated. Therefore, they are not suited for use as a solvent.

For semiconductor systems such as, for example AlGaAs, AlGaInP, HgZnTe, or MgZnCdSSe compounds, the molten material used is a single molten material, such as Ga, Al, In, or Hg or their compounds (i.e. an alloy), or a compound molten material, such as Mg, Zn, or Cd (i.e. an alloy).

The atmosphere that is in contact with the solvent is an atmosphere where the volatile component that is dissolved in the solvent is very volatile, preferably an atmosphere of rich gas components that readily react with the volatile component, or an atmosphere where the partial pressure of the volatile component is less than the vapor pressure of the volatile component in the solvent.

For example, where the compound solid state material system is a GaAs, GaN, or ZnSSe semiconductor system, the atmosphere may be, for example an atmosphere where a portion of the atmosphere is replaced by $H_2$ or other gases that readily react with As, N, S, or Se, an atmosphere of an inert gas such as Ar or He where the partial pressure of As, N, S, or Se is sufficiently less than their vapor pressures in the solvent, or a vacuum atmosphere.

When the solvent is placed in contact with the desired etching location on the surface of the compound solid state material, the material dissolves in the solvent. Because the other surface of the solvent is in contact with an atmosphere and the highly volatile component dissolved in the solvent rapidly evaporates in this atmosphere, a volatile component in said material component that is dissolved in the solvent readily evaporates. Consequently, the solvent is not saturated by the material structural component to be etched (i.e. the volatile component). Therefore, etching of the entire etching target is possible without requiring frequent replacement of the solvent or using a large amount of solvent as in the past, all with excellent workability.

A solvent, such as a thin film or a solvent with a component added to increase the diffusion speed of the volatile component, is preferably used so that the time required for the volatile component to move from the solid phase interface (i.e. the surface in contact with the solid state material to be etched) in the solvent to the vapor phase (i.e. the surface in contact with the atmosphere) is extremely short.

When the former solvent is used as a thin film, the diffusion distance from the solid phase interface to the vapor phase interface becomes short, and the volatile component moves in a short time from the solid phase interface to the vapor phase interface.

When a solvent with a component added to increase the diffusion speed of the volatile component is used, for example when Bi is added to molten Ga material (when molten Ga material is used as the solvent when a GaN semiconductor is etched), the diffusion speed of N increases in the solvent because of the effect of Bi, and N moves from the solid state interface to the vapor phase interface in a short time. The added component is appropriately selected considering the types of volatile components in the compound solid state material to be etched. Even with this added amount, there are no particular restrictions on the component as long as the diffusion speed of the volatile component is increased.

In the invention, there are no particular restrictions on the temperature at which the solvent is used, although generally the temperature is as high as possible within a range lower than the melting point of the compound solid state material to be etched and lower than the boiling point of the solvent. This temperature range is preferred because at higher temperatures the solubility of the solid state material increases and the vapor pressure of the volatile component becomes higher, while at lower temperatures the structure of the solid state material is maintained. Consequently, in the invention, an appropriate temperature for the compound solid state material to be etched is selected by taking these circumstances into consideration.

In the invention, when an atmosphere of a rich gas component that readily reacts with the volatile component is used, because the amount of the readily reacting component is gradually decreased by the reaction of the volatile component with the readily reacting component, there is no longer a sufficient amount of solvent to react with the volatile component. Thus, the atmosphere starts to draw out a part of the reaction product of the volatile component with the readily reacting component throughout the entire etching process (in fact, mixed gas of the reaction product and the readily reacting component). As a result, an amount of the readily reacting component should be replenished that corresponds to the amount drawn out.

When the atmosphere used is a vacuum atmosphere or an inert gas atmosphere where the partial pressure of the volatile component is sufficiently less than the vapor pressure of the volatile component in the solvent, the partial pressure of the volatile component in the atmosphere is gradually increased by evaporating the volatile component that is dissolved in the solvent. In this case, the mixed gas of the volatile component and an inert gas component, such as Ar or He, draws out a part of the volatile component throughout the entire etching process. Only the drawing out process is acceptable when a vacuum atmosphere is used; while replenishing the inert gas component corresponding to the amount drawn out is preferred when an inert gas atmosphere is used.

BRIEF DESCRIPTION OF THE DRAWINGS

FIGS. 1(A) to 1(E) provide an example of an embodiment of the invention that is applied to etching a semiconductor and illustrates the overall processing steps in accordance with the invention;

FIGS. 3(A) to 3(C) illustrate the etching process in accordance with the second embodiment of the invention.

DETAILED DESCRIPTION OF THE INVENTION

Figure 2A:
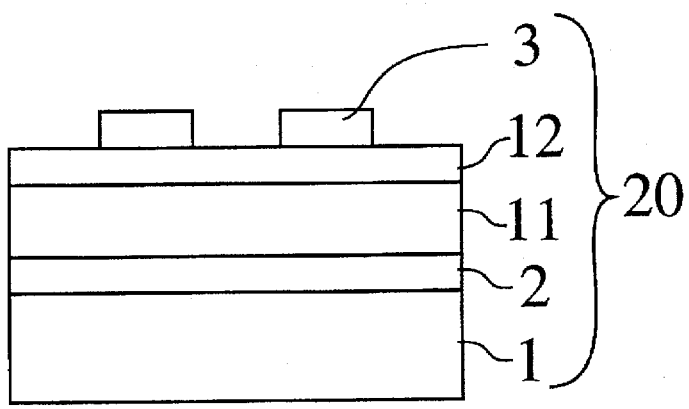
FIGS. 2(A) to 2(C) illustrate the etching state of an etching target in a second embodiment of the invention.
Figure 2B:
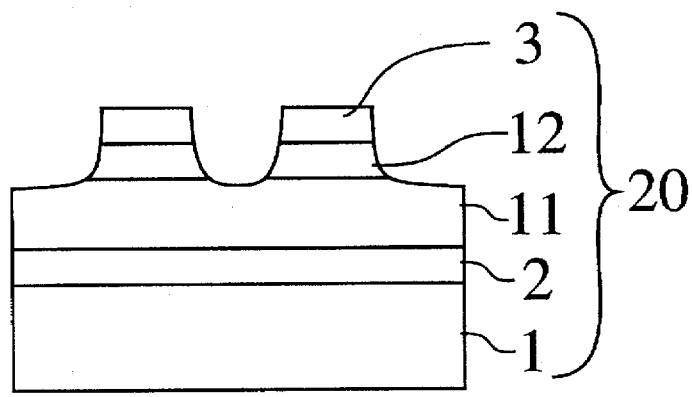

FIGS. 1(A) to 1(E) illustrate the overall process when the invention is applied to a GaN semiconductor. A GaN semiconductor is a chemically stable material. For such material, wet etching with an ordinary etchant is very difficult.

FIG. 1(A) is a side view showing the desired pattern mask layer 3 formed on the surface of the GaN semiconductor layer 2, where the layer 2 is grown on a sapphire substrate 1. The mask layer 3 is formed from a material, such as $SiO_2$, which is not dissolved or melted in the solvent (a molten Ga material in this embodiment).

The material shown in FIGS. 1(A) to 1(E) (hereinafter also referred to as the etching target) is placed in a chamber, which is not shown. The chamber contains an atmosphere of combustible gas that readily reacts with the N of the GaN semiconductor (in this example, $H_2$ replacement atmosphere is used); or the chamber may contain an Ar replacement atmosphere under a sufficiently small $N_2$ partial pressure.

FIG. 1(B) shows a part of the surface of the solvent 4 placed in contact with the surface of the etching target when the etching target is placed in the chamber; and also shows the surfaces of the GaN semiconductor layer 2 and mask layer 3. In this example, a crucible 5 is used to replenish the solvent 4 provided in a heating stage (not shown). As a result, side b of the solvent 4, which corresponds to the bottom of the crucible 5, is in contact with the surfaces of the GaN semiconductor layer 2 and the mask layer 3. Surface t, which corresponds to the top surface of the crucible 5, is in contact with the $H_2$ or Ar atmosphere in the chamber.

As with the mask layer 3, the crucible 5 uses a material that may not be melted and that may not be dissolved in the solvent such as, for example a carbon material. The bottom surface area of the crucible 5, i.e. the surface area where the solvent 4 is in contact with the etching target, is not particularly restricted. An area where the etching is highly efficient and no difficulties arise in handling the crucible 5 is acceptable. The capacity of crucible 5 is not limited as long as the capacity is sufficient to receive the total amount of solvent 4 that is used in the initial stage of etching and the total amount of material (GaN semiconductor) that melts during the etching process.

FIG. 1(C) includes arrows that indicate what happens when the part of the GaN semiconductor layer 2 that is in contact with surface b of solvent 4 and the structural components of the melted semiconductor layer 2, in this example Ga and N, are dissolved in the solvent 4. When etching of the GaN semiconductor layer 2 in the part in contact with surface b of the solvent 4 ends, the crucible 5 is moved to the next etching part and etching is performed in a manner similar to that shown on FIG. 1(C).

In a normal meltback process, the solvent 4 in the crucible 5 is saturated by N when returning from this operation. However, in the invention (as shown on FIG. 1(D), showing the expansion at the same degree as in FIG. 1(C)), N in the solvent 4 evaporates in the chamber from surface t of the solvent 4, as indicated by the β arrows, and reacts with $H_2$ in the chamber ($2N+3H_2 \rightarrow 2NH_3\uparrow$); or it remains unchanged and evaporates into the atmosphere in a chamber having a small $N_2$ partial pressure. Because the saturation state of N in the solvent 4 is avoided, the solvent 4 can efficiently proceed with etching the GaN semiconductor layer 2 that is in contact with its surface b.

FIG. 1(E) (same expansion as in FIG. 1(C)) shows the etching target when etching is completed. In the etched part of the target, the surface of the sapphire substrate 1 is exposed. In the parts formed by the mask layer 3, the GaN semiconductor layer 2 remains. Because of this state, if the mask layer 3 is removed, the desired etching process ends.

A specific embodiment of the method of the invention follows:

EMBODIMENT 1

According to the process illustrated in FIGS. 1(A) to 1(E), the etching target was etched using the conditions listed in Table 1.

TABLE 1

| | |
|---|---|
| Sapphire substrate 1: | Thickness; 450 μm |
| | Area; 1 cm² |
| GaN semiconductor layer 2: | Thickness; 4 μm |
| | Area; 1 cm² |
| Mask layer 3: | Material; $SiO_2$ |
| | Thickness; 0.1 μm |
| | Growth method; CVD |
| Crucible 5: | Material; carbon |
| | Size; crucible having 1 × 1 cm cross-section, 1 cm length, 2 mm wall thickness |
| | Heating method; resistance heating |
| | Movement method; Adopted a method that is moved to the moving pattern included beforehand in the CPU and is linked to the motion mechanism set up outside the chamber. |
| Molten Ga object 4: | Starting use quantity; 50% of crucible's 5 capacity. |
| | Maintenance temperature; 1,050° C. |
| Chamber: | Starting atmosphere; Replaced by $H_2$ |
| | Atmospheric pressure; 1 atm |

The chamber has a gas inlet port and gas exhaust port. During the etching operation, the desired amount of $H_2$ and $NH_3$ gas mixture is exhausted from the gas exhaust port (500 cc/min.). The $H_2$ at the amount appropriate for this exhaust amount (500 cc/min.) is introduced from the inlet port. The pressure listed in Table 1 is maintained.

When etching is performed according to the above conditions, etching of the entire surface of the etching target can be performed in 120 minutes. The etching results in an etching surface that is smooth and the etching form of the desired pattern is well formed.

COMPARATIVE EXAMPLE 1

In embodiment 1, the chamber is sealed and filled with $N_2$ gas. Etching here is performed in the same way as embodiment 1 except the chamber is sealed and there is a lid on top of the crucible 5. As a result, the etching no longer proceeds during the etching step and etching of the entire surface of the etching target was not possible. However, the etched surface was smooth.

EMBODIMENT 2

The etching target 20 is formed from a mask layer 3 under the conditions shown in Table 1, where the mask layer is formed on a semiconductor wafer having the structure shown in FIG. 2(A) (a GaN layer having a 0.1μ thickness) and that is in turn formed on the sapphire substrate 1 under the conditions listed in Table 1, on the InGaN layer 12 (0.1μ thickness)). Etching is performed by the process shown in FIGS. 3(A) to 3(C).

In FIG. 3(A), the etching target 20 is placed on the wafer mounting section of a carbon rack 21. The sealed chamber holds $N_2$ in an Ar gas atmosphere of less than 1 ppm and is moved on the rack 21. One solvent 41 (GaIn alloy, temperature maintained at 800° C.) in the crucible 51 under the conditions listed in Table 1 (in this example, a barrier wall 52 is placed in the center and receives two types of solvents) is positioned on top of the etching target 20. The first etching lasts 30 minutes.

By etching, the etching target 20 has an etched InGaN layer 12 but the mask layer 3 below remains. Next, the rack 21 is moved in the direction shown by the arrow. The etching target 20 is positioned below the other solvent 42 (AlGa alloy, temperature maintained at 1,100° C.) in the crucible 51. The second etching lasts 90 minutes.

Figure 2C:
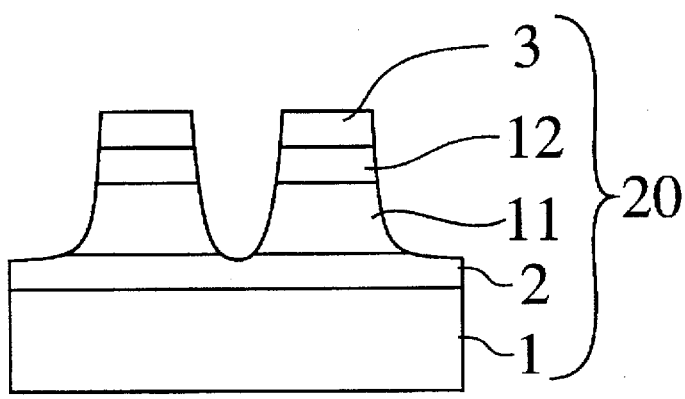

As a result of this etching, the etching target 20 is etching the AlGaN layer 11, the mask layer 3, and the InGaN layer 12 underneath remain as shown on FIG. 2(C). Then, as shown on FIG. 3(C), the rack 21 is moved in the direction of the arrow until the etching target 20 is positioned at the location where the crucible 51 is not present. The above etching produces an etching surface that is smooth and a well formed etching shape having the desired pattern.

As described above, according to the invention, a condition does not arise where the solvent is saturated by the volatile component and etching is no longer performed. Therefore, frequently replacement of the solvent is not needed. In addition, excellent etching can be performed over the entire surface of the desired portion of the compound solid state material that comprises the etching target.

Because it is not necessary to use a large amount of solvent, even where the etching target is small and/or the etching locations are fine, the invention is adaptively applied on a wide range of targets. In addition, the running costs and equipment costs are reduced. Moreover, a fast etching speed (which is an advantage of the meltback method) and a smooth etching surface can both be obtained.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A method for etching compound solid state material, comprising the steps of:

providing a solvent that dissolves said material to yield at least one volatile component that is readily evaporated into an atmosphere; and placing said solvent in contact with a surface of said material with a surface of said solvent in contact with said atmosphere.

2. The method of claim 1, wherein the solvent is in a form of a thin film.

3. The method claim 1, wherein said solvent comprises a component added to accelerate diffusion of said volatile components.

4. The method of claim 1, wherein said atmosphere is an atmosphere of a rich gas component that readily reacts with at least one volatile component in the structural components of the compound solid state material, or an atmosphere where the partial pressure of said volatile component is less than the vapor pressure of said volatile component in the solvent.

5. The method of claim 1, wherein said solvent is a molten material containing the same component as at least one hardly volatile component in the structural components of the compound solid state material, or a molten material exhibiting solubility in the compound solid state material.

6. The method claim 5, wherein said solvent comprises a component added to accelerate diffusion of the volatile components.

7. The method of claim 5, wherein said atmosphere is an atmosphere of a rich gas component that readily reacts with at least one volatile component in the structural components of the compound solid state material, or an atmosphere where the partial pressure of said volatile component is less than the vapor pressure of said volatile component in the solvent.

8. The method of claim 5, wherein the solvent is in a form of a thin film.

9. The method claim 8, wherein said solvent comprises a component added to accelerate diffusion of the volatile components.

10. The method of claim 9, wherein said atmosphere is an atmosphere of a rich gas component that readily reacts with at least one volatile component in the structural components of the compound solid state material, or an atmosphere where the partial pressure of said volatile component is less than the vapor pressure of said volatile component in the solvent.

* * * * *